(12) United States Patent
Bao et al.

(10) Patent No.: US 11,387,335 B2
(45) Date of Patent: Jul. 12, 2022

(54) OPTIMIZED CONTACT STRUCTURE

(71) Applicant: QUALCOMM Incorporated, San Diego, CA (US)

(72) Inventors: Junjing Bao, San Diego, CA (US); Jun Yuan, San Diego, CA (US); Peijie Feng, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 41 days.

(21) Appl. No.: 17/061,709

(22) Filed: Oct. 2, 2020

(65) Prior Publication Data

US 2022/0109053 A1 Apr. 7, 2022

(51) Int. Cl.
| | |
|---|---|
| *H01L 29/417* | (2006.01) |
| *H01L 29/40* | (2006.01) |
| *H01L 29/423* | (2006.01) |
| *H01L 21/768* | (2006.01) |
| *H01L 21/3213* | (2006.01) |
| *H01L 29/45* | (2006.01) |

(52) U.S. Cl.
CPC .. *H01L 29/41775* (2013.01); *H01L 21/76883* (2013.01); *H01L 29/401* (2013.01); *H01L 29/41766* (2013.01); *H01L 29/4236* (2013.01); *H01L 21/32139* (2013.01); *H01L 29/45* (2013.01)

(58) Field of Classification Search
CPC ............. H01L 29/41775; H01L 29/401; H01L 29/41766; H01L 29/45; H01L 29/41725; H01L 21/32139; H01L 21/76883; H01L 21/823418; H01L 21/32133
See application file for complete search history.

(56) References Cited

U.S. PATENT DOCUMENTS

| | | | |
|---|---|---|---|
| 2015/0206946 A1* | 7/2015 | Chen | H01L 29/0847 438/300 |
| 2016/0049332 A1 | 2/2016 | Xie et al. | |
| 2016/0141379 A1 | 5/2016 | Zang et al. | |
| 2018/0114846 A1 | 4/2018 | Alptekin et al. | |
| 2018/0308750 A1 | 10/2018 | Cheng et al. | |
| 2020/0075595 A1 | 3/2020 | Shin et al. | |

OTHER PUBLICATIONS

International Search Report and Written Opinion—PCT/US2021/045420—ISA/EPO—dated Nov. 12, 2021.

\* cited by examiner

*Primary Examiner* — Joseph C. Nicely
(74) *Attorney, Agent, or Firm* — Qualcomm Incorporated

(57) ABSTRACT

Disclosed are optimized contract structures and fabrication techniques thereof. At least one aspect includes a semiconductor die. The semiconductor die includes a substrate and a contact disposed within the substrate. The contact includes a first portion with a first vertical cross-section having a first cross-sectional area. The first vertical cross-section has a first width and a first height. The contact also includes a second portion with a second vertical cross-section having a second cross-sectional area less than the first cross-sectional area. The second vertical cross-section includes a lower portion having the first width and a second height less than the first height, and an upper portion disposed above the lower portion and having a second width less than the first width and having a third height less than the first height.

39 Claims, 9 Drawing Sheets

OPTIMIZED CONTACT STRUCTURE

FIELD OF DISCLOSURE

This disclosure relates generally to wafer fabrication methods, and more specifically, but not exclusively, to an optimized contract structure and fabrication techniques thereof.

BACKGROUND

FIG. 1A illustrates a portion of a conventional complimentary metal-oxide semiconductor (CMOS) structure having contacts and a gate, such as, for example, a simple inverter having n-type (NMOS) and p-type (PMOS) transistors. In the structure shown in FIG. 1A, the contacts and the gate are vertical plate structures of an electrically conducting material, parallel and in proximity to each other. This gives rise to parasitic capacitance between each contact and the gate. The parasitic capacitance is proportional to the areas of the contact and gate that are parallel to each other and inversely proportional to the distance, labeled in FIG. 1A as D1, between the surfaces of the contact and gate that face each other. The operating speed of a CMOS device is inversely proportional to this parasitic capacitance, and therefore it is desirable to reduce the parasitic capacitance between contact and gate (herein referred to as the "contact-gate capacitance"). Reducing this capacitance will increase the operating speed of, and thus the performance of, the CMOS device.

FIG. 1B illustrates one conventional approach that has been taken to reduce the contact-gate capacitance in a CMOS device, In the CMOS structure illustrated in FIG. 1B, a portion of the contacts is removed in order to reduce the area of the contact that is parallel to the gate structure, which reduces the contact-gate parasitic capacitance. The height of the remaining contact structure is labeled as H in FIG. 1B. However, this approach has disadvantages: removing portions of the contact structure increases the internal resistance of the contact because the cross-sectional area is much smaller, which reduces performance, and removing too much of the contact structure may cause an electrical open condition. To avoid the possibility of an electrical open and to maintain an acceptably low internal resistance, the height H is set to a conservative value. On the other hand, if not enough of the contract structure is removed, e.g., the height H is too conservative, the reduction in parasitic capacitance will be insignificant.

Accordingly, there is a need for systems, apparatus, and methods that overcome the deficiencies of conventional approaches to reducing contact-gate capacitance, including the methods, system and apparatus provided herein.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

In accordance with the various aspects disclosed herein, at least one aspect includes a semiconductor die. The semiconductor die includes a substrate and an contact disposed within the substrate. The contact includes a first portion with a first vertical cross-section having a first cross-sectional area. The first vertical cross-section has a first width and a first height. The contact also includes a second portion with a second vertical cross-section having a second cross-sectional area less than the first cross-sectional area. The second vertical cross-section includes a lower portion having the first width and a second height less than the first height, and an upper portion disposed above the lower portion and having a second width less than the first width and having a third height less than the first height.

In accordance with the various aspects disclosed herein, at least one aspect includes a method for fabricating a semiconductor die. The method includes providing a substrate and creating a contact at least partially embedded within the substrate. The contact includes a first portion with a first vertical cross-section having a first cross-sectional area. The first vertical cross-section has a first width and a first height. The contact also includes a second portion with a second vertical cross-section having a second cross-sectional area less than the first cross-sectional area. The second vertical cross-section includes a lower portion having the first width and a second height less than the first height, and an upper portion disposed above the lower portion and having a second width less than the first width and having a third height less than the first height.

In accordance with the various aspects disclosed herein, at least one aspect includes a method for fabricating a contact. The method includes creating, within a substrate, a contact hole having a first width, a first length, and a first depth. The method includes depositing, within at least a portion of the contact hole, an electrically conducting material forming a first portion of a contact. The method includes etching the first portion of the electrically conducting material to create a recess having the first width, a second length less than the first length, and a second depth less than the first depth. The method includes depositing, with the recess, a conformal spacing material having a thickness T. The method includes anisotropically etching the conformal spacing material to a depth=T to expose the electrically conducting material at the bottom of the recess. The method includes selectively depositing additional electrically conducting material over the exposed electrically conducting material up to a third depth less than the second depth, forming an upper portion of the second portion of the contact having a second width and a third length less than the second length, a lower portion of the second portion of the contact having the first width and the first height. The method includes removing the conformal spacing material to create a gap between the outer surfaces of the second portion of the contact and the inner surfaces of the recess.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure. Figures are not to scale.

Figure 1A:
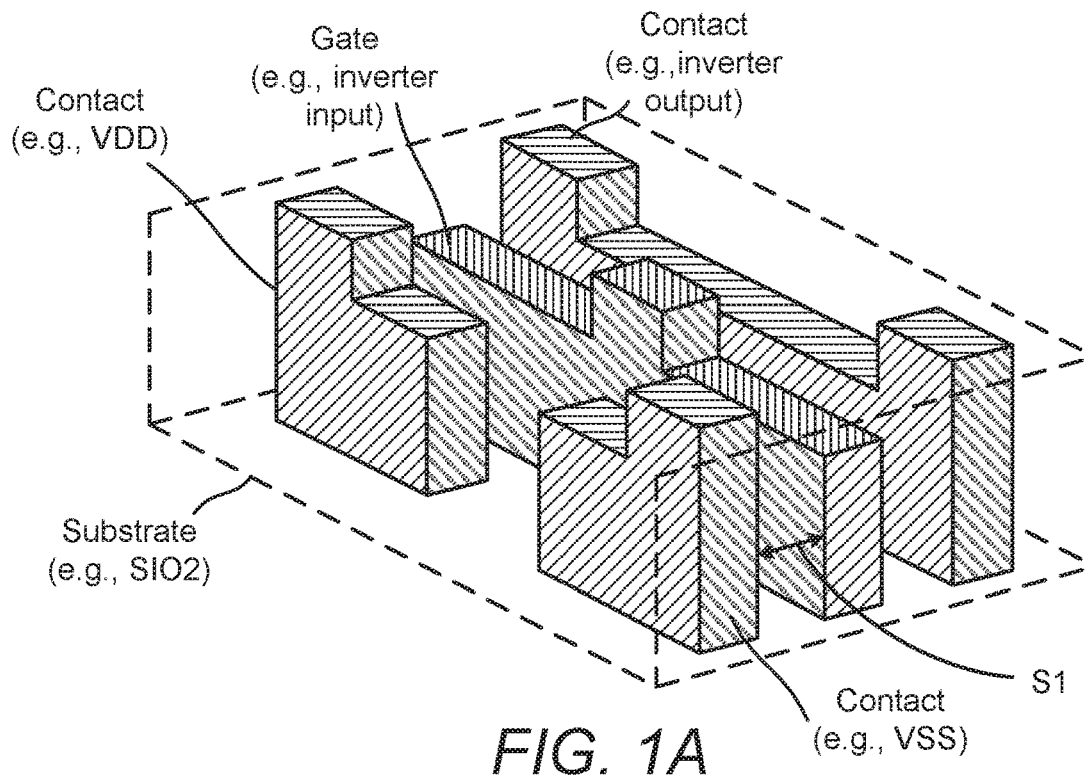
FIG. 1A illustrates a portion of a conventional complimentary metal-oxide semiconductor (CMOS) structure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Aspects of the present disclosure are illustrated in the following description and related drawings directed to specific embodiments. Alternate aspects or embodiments may be devised without departing from the scope of the teachings herein. Additionally, well-known elements of the illustrative embodiments herein may not be described in detail or may be omitted so as not to obscure the relevant details of the teachings in the present disclosure.

In certain described example implementations, instances are identified where various component structures and portions of operations can be taken from known, conventional techniques, and then arranged in accordance with one or more exemplary embodiments. In such instances, internal details of the known, conventional component structures and/or portions of operations may be omitted to help avoid potential obfuscation of the concepts illustrated in the illustrative embodiments disclosed herein.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

In order to fully illustrate aspects of the design of the present disclosure, methods of fabrication are presented. Other methods of fabrication are possible, and the discussed fabrication methods are presented only to aid understanding of the concepts disclosed herein.

Figure 2A:
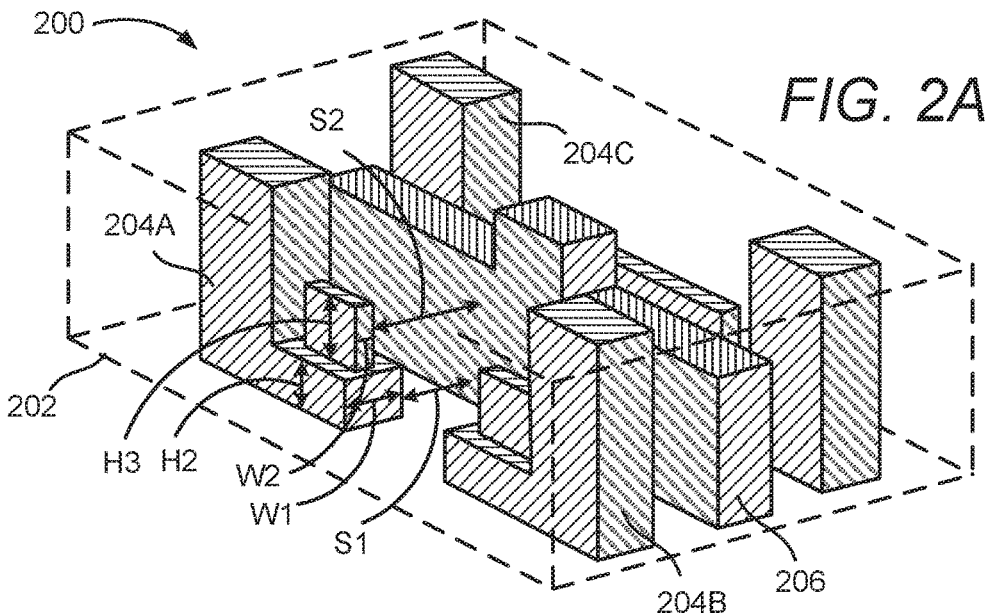
FIGS. 2A through 2C illustrate views of portions of an optimized contact according to some aspects.

FIG. 2A illustrates a perspective view of a portion of a semiconductor die 200 having optimized contacts according to some aspects. In FIG. 2A, semiconductor die 200 includes a substrate 202, in which is partially embedded a contact 204A, a contact 204B, and a contact 204C, which may be collectively referred to as contacts 204. The contacts 204 may be made of tungsten, cobalt, or other electrically conducting material. Also partially embedded in the substrate 202 is a gate 206. The contact 204 and the gate 206 are separated by some distance, where the minimum distance between a contact 204 and the gate 206 is distance S1. Each contact 204 includes a first portion having a first vertical cross-section having a first area and a second portion having a second vertical cross-section having a second area. The first portion has a height of H1 and a width of W1. The second portion having a second vertical cross-section includes a lower portion having a height of H2 and a width of W1 and being distance S1 from the gate 206, and an upper portion having a height of H3 and a width of W2 (where W2 is less than W1) and being a distance S2 from the gate 206 (where S2 is greater than S1). An electrical contact 208 connects the contact 204A to higher level conductors, and an insulating layer 210 exists between the contact 204A and the substrate 202. In some aspects, H1 is approximately 50 nm, H2 is approximately 10 nm, and H3 can be in the 10 nm-30 nm range.

Figure 2B:
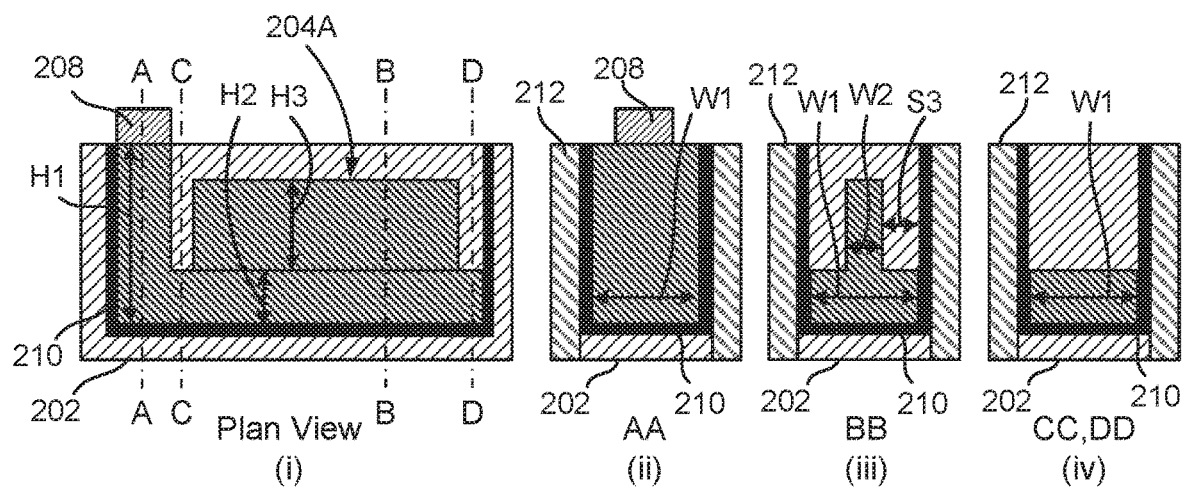

FIG. 2B illustrates a plan view (i) and three cross-sectional views (ii), (iii), and (iv), of an optimized contact 204A according to some aspects. In FIG. 2B, contact 204A has a first cross-section AA having a first cross-sectional area and a second cross-section BB having a second cross-sectional area. In cross-sectional views (ii) through (iv), the contact 204A is flanked on each side by spacer material 212.

In cross-sectional view AA (ii), the entire cross-sectional area of contact 204A has width W1, and it extends up to the surface of the substrate 202 to electrical contact 208. In FIG. 2B, contact 204A has a second cross-section BB having a second cross-sectional area.

In cross-sectional view BB (iii), a lower portion has width W1 and height H2, and an upper portion has width W2 and height H3 above the top of the lower portion, where W2 is less than W1. Because W2 is less than W1, the upper portion of cross-section BB is distance S3 farther away from the gate 206 compared to a conventional contact. For convenience only, and without imposing any limitation of the subject matter claimed, the upper portion may be herein referred to as a vertical fin. In some aspects, such as those shown FIGS. 2A, 2B, and 2C, the vertical fin has a cross-sectional shape that is substantially rectangular.

Cross-sectional views CC and DD (iv) look similar to each other. As will be explained in more detail below, these cross-sections do not have an upper portion with width W2 and height H3 due to an artifact of the wafer process that creates the cross-section BB.

Figure 1B:
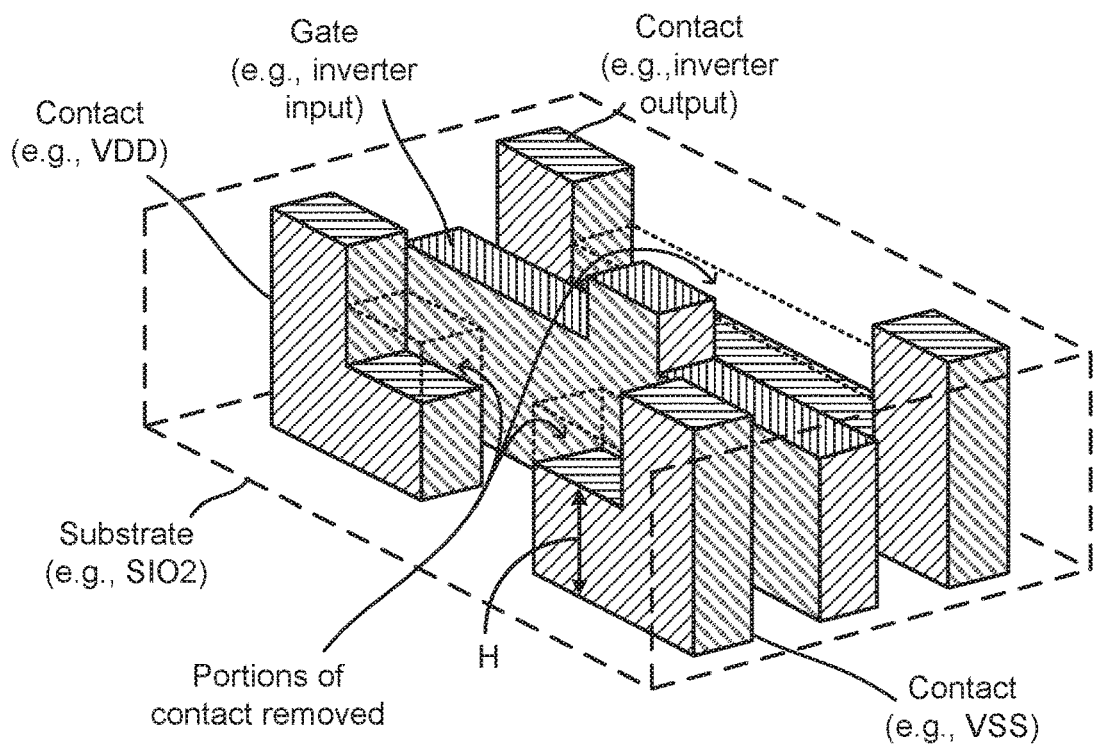
FIG. 1B illustrates a conventional approach to reducing contact-gate parasitic capacitance.

Since capacitance is inversely proportional to distance between the conducting plates, the parasitic capacitance between contact 204A and gate 206 is reduced compared to the conventional structures in FIG. 1A and FIG. 1B, and cross-section BB has a cross-sectional area large enough to minimize the increase in internal resistance of contact 204A.

Figure 2C:
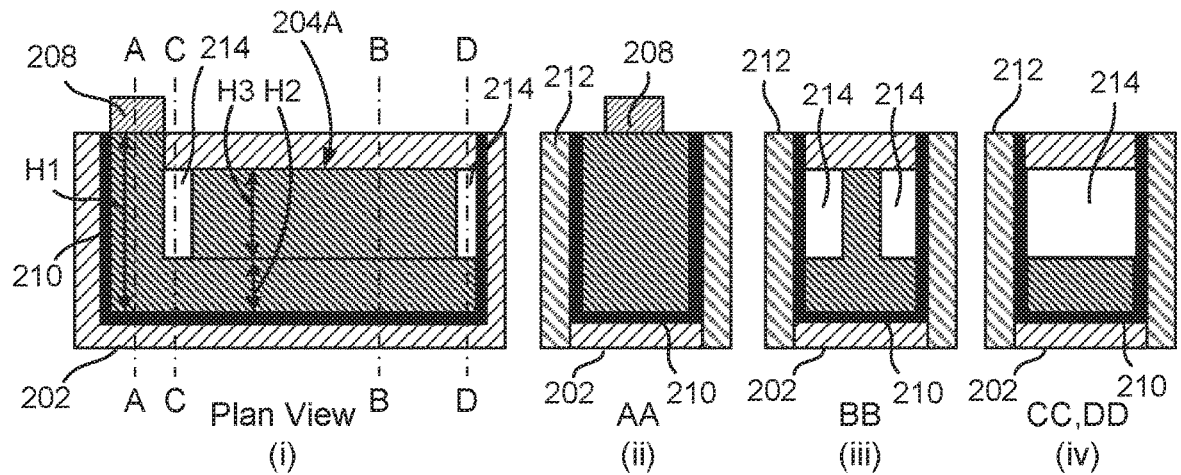

FIG. 2C illustrates a plan view (i) and three cross-sectional views (ii), (iii), and (iv) of an optimized contact 204A according to some aspects. The contact 204A in FIG. 2C differs from the contact 204A in FIG. 2B in that, in FIG. 2B, the upper portion of the contact (i.e., the vertical fin) is surrounded by, and in contact with, $SiO_2$ or other insulating material, but in FIG. 2C, the vertical fin is surrounded by an air gap 214, which has a higher dielectric coefficient than $SiO_2$ and thus reduces the parasitic contact-gate capacitance even more compared to the contact 204A in FIG. 2B.

Figure 3A:
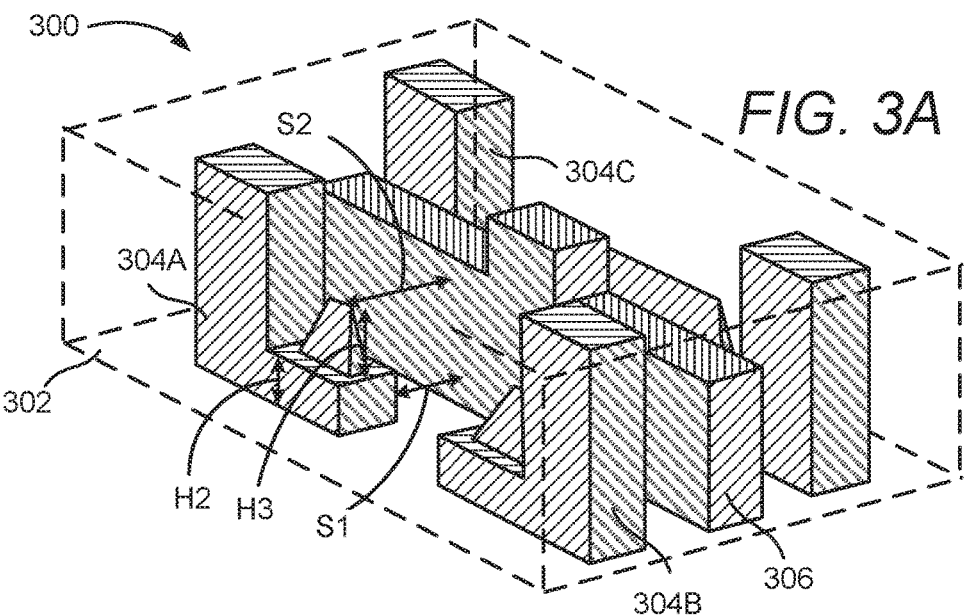
FIGS. 3A through 3C illustrate views of portions of an optimized contact according to some aspects.

FIG. 3A illustrates a perspective view of a portion of a semiconductor die 300 having optimized contacts according to some aspects. In FIG. 3A, semiconductor die 300 includes a substrate 302, in which is partially embedded a contact 304A, a contact 304B, and a contact 304C, which may be collectively referred to as contacts 304. Also partially embedded in substrate 302 is a gate 306. Each contact 304 includes a first portion having a first vertical cross-section having a first area and a second portion having a second vertical cross-section having a second area. The minimum distance between a contact 304 and the gate 306 is distance S1. Each contact 304 includes a first portion having a first vertical cross-section having a first area and a second portion having a second vertical cross-section having a second area. The second portion having a second vertical cross-section includes a lower portion having a height of H2 and a width of W1 and being distance S1 from the gate 206, and an upper portion having a height of H3 and a maximum width of W2 (where W2 is less than W1) and being an average distance S2 from the gate 206 (where S2 is greater than S1). An electrical contact 308 connects the contact 304A to higher level conductors, and an insulating layer 310 exists between the contact 304A and the substrate 302. In some aspects, such as shown in FIGS. 3A, 3B, and 3C, the upper portion of the second portion of the contact has a cross-sectional shape that is substantially triangular.

Figure 3B:
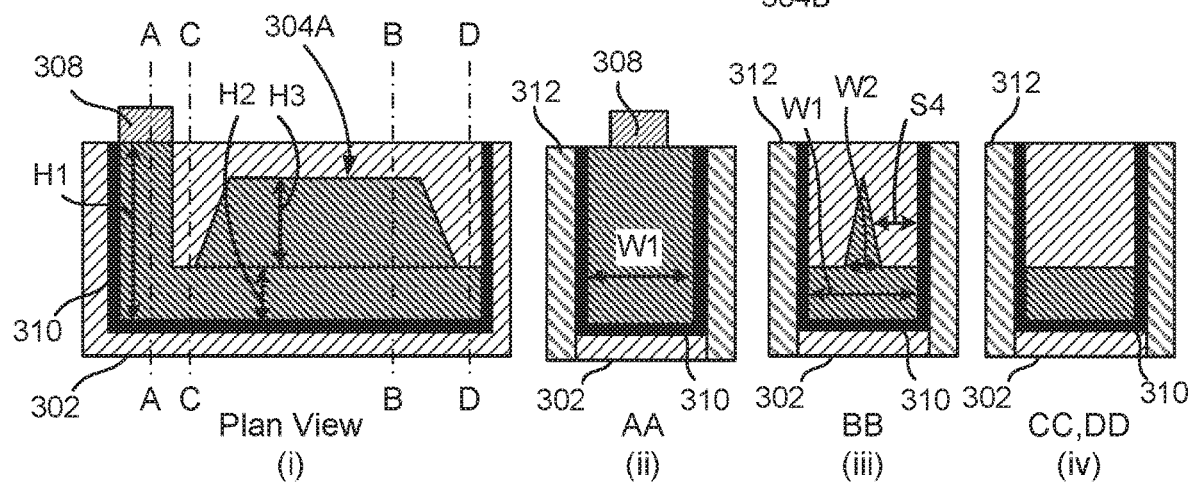
Figure 3C:
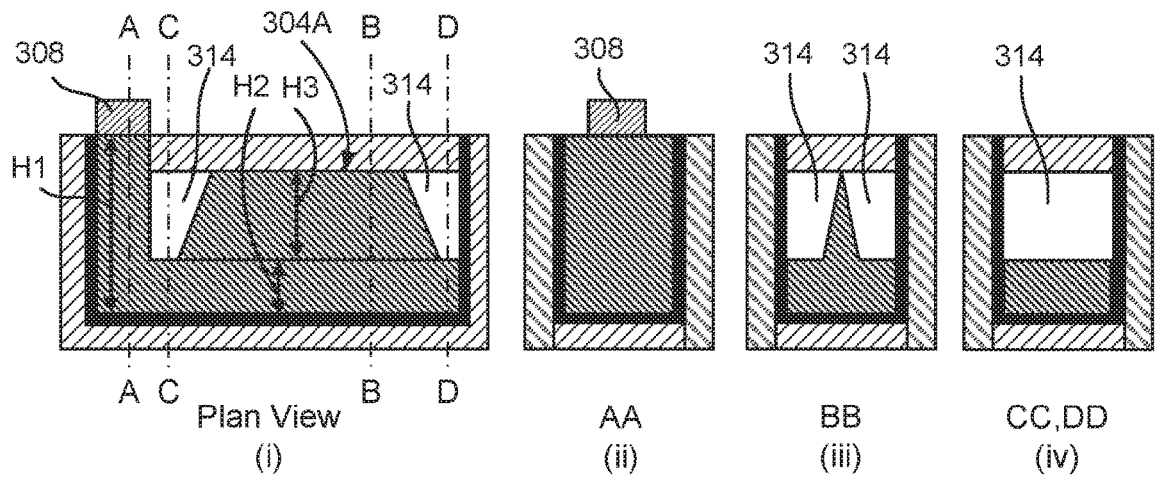

FIG. 3B illustrates a plan view (i) and three cross-sectional views AA (ii), BB (iii), and CC,DD (iv), of a contact 304A according to some aspects. In FIG. 3B contact 304A has a first cross-section AA having a first cross-sectional area. In cross-sectional views (ii) through (iv), the contact 304A is flanked on each side by spacer material 312.

In cross-sectional view AA (ii), the entire cross-sectional area of contact 302A has width W1, and it extends up to the surface of the substrate 302 to electrical contact 308. In FIG. 3B contact 304A has a second cross-section BB having a second cross-sectional area.

In cross-sectional view BB (iii), a lower portion has width W1 and height H2, and an upper portion has cross-sectional shape that is substantially triangular, the triangle having a base of width W2 and a height H3 above the top of the lower portion, where W2 is less than W1. Because W2 is less than W1, and because the upper portion is substantially triangular in cross-section, the upper portion of cross-section BB is an average distance S4 farther away from the gate 306 compared to a conventional contact.

Cross-sectional views CC and DD (iv) look similar to each other. As will be explained in more detail below, these cross-sections do not have an upper portion with width W2 and height H3 due to an artifact of the wafer process that creates the cross-section BB.

Since capacitance is inversely proportional to distance between the conducting plates, the parasitic capacitance between contact 304A and gate 306 is reduced compared to the conventional structures in FIG. 1A and FIG. 1B, and is reduced compared to the contact 202A for the same values of W1 and H2. However, because the cross-sectional area of cross-section BB for contact 304A is less that the cross-sectional area of cross-section BB for contact 204A, the internal resistance of contact 304A may be slightly higher than the internal resistance of contact 204A for the same values of W1 and H2.

FIG. 3C illustrates a plan view (i) and three cross-sectional views AA (ii), BB (iii), and CC,DD (iv) of a contact 304A according to some aspects. The contact 304A in FIG. 3C differs from the contact 304A in FIG. 3B in that, in FIG. 3B, the upper portion of the contact is surrounded by, and in contact with, $SiO_2$ or other insulating material, but in FIG. 3C, the upper portion of the contact is surrounded by an air gap 314, which has a higher dielectric coefficient than $SiO_2$ and thus reduces the parasitic contact-gate capacitance even more compared to the contact 302A in FIG. 3B.

Figure 4:
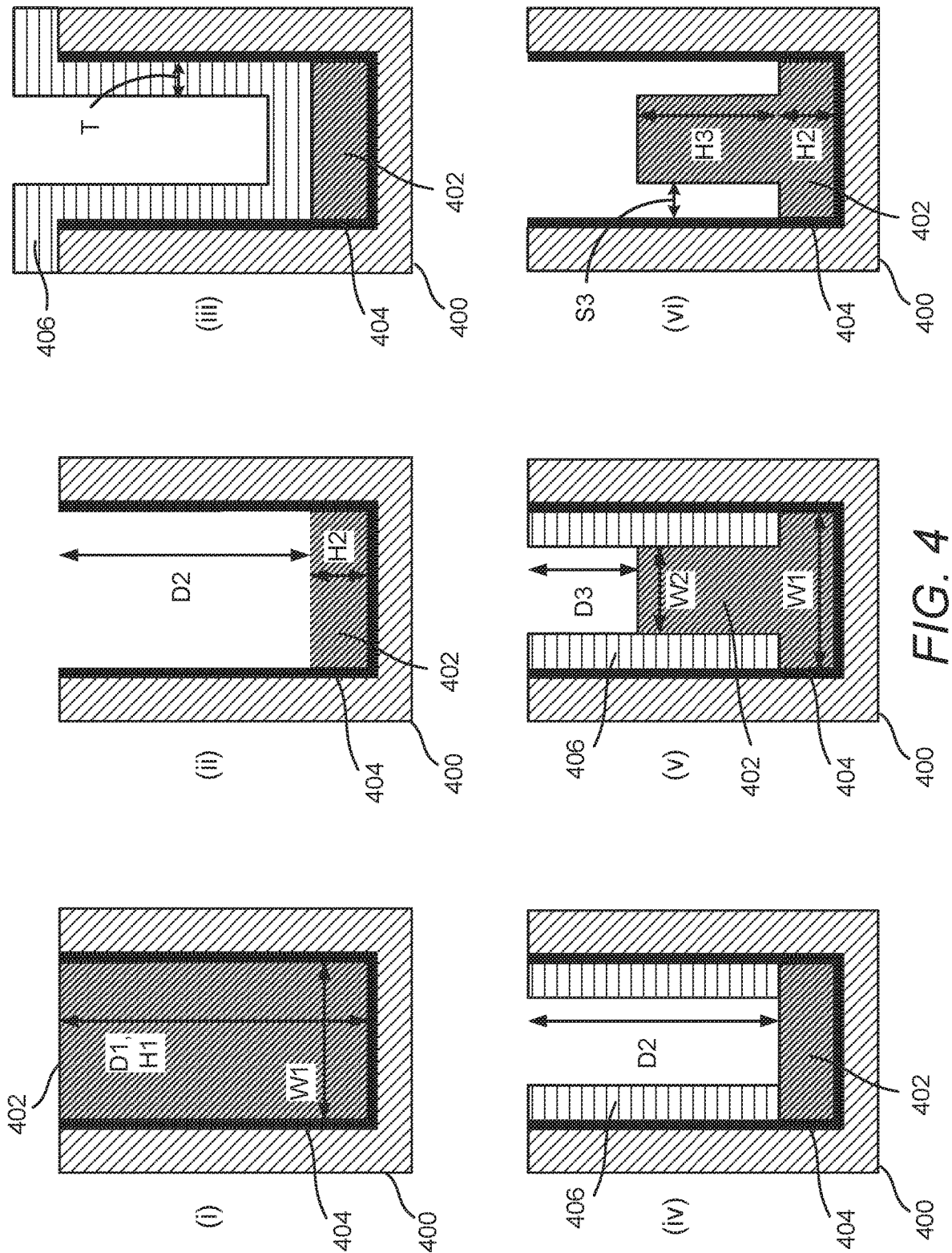
FIGS. 4 through 6 illustrate portions of exemplary processes for fabricating an optimized contact according to some aspects.

FIG. 4 illustrates portions of exemplary processes for fabricating an optimized contact according to some aspects. FIG. 4 shows what will become the equivalent of the cross-section BB of an optimized contact, such as any of the contacts 204 in FIG. 2 or any of the contacts 304 in FIG. 3. In FIG. 4, (i) shows the process after steps that result in a substrate 400 including an embedded contact 402 having a width W1, a depth D1 (which may also be referred to as a height H1), and a length L1 (not visible in this cross-sectional view), surrounded by an insulating layer 404, e.g., a contact hole is filled with tungsten (element abbreviation "W") via chemical vapor deposition (CVD) followed by chemical mechanical planarization (CMP). In FIG. 4, (ii) shows the results of an etching step that includes protecting a first portion of the tungsten from etching but vertically etching a second portion of the tungsten, which removes some of the tungsten and leaves a recess of depth D2, with the remaining tungsten having a width W1 and a height H2. In FIG. 4, (iii) shows the results of deposition of a conformal material to create a sacrificial spacer 406 having a thickness T. In FIG. 4, (iv) shows the results of an anisotropic etch of the sacrificial spacer 406, in which the contact 402 is exposed at the bottom portion of the recess. In FIG. 4, (v) shows the results of a selective tungsten deposition step, which at least partially fills the recess created at (ii) and creates an upper portion of the contact 402 having a second width W2 less than W1. In FIG. 4, (vi) shows the results of a selective etch to remove the sacrificial spacer 406. In FIG. 4, the gap so created has a width of S3. The width of the lower portion of the contact 402 will have a width of W1 and a height of H2 and the upper portion of the contact 402 will have a width of W2 and a height of H3. The second width W2 will be a function of the first width W1 and the thickness of the sacrificial layer T such that W2=W1−2*T. Although not shown in the cross-sectional view in FIG. 4, the upper portion of the contact 402 will also have a length L2=L1−2*T. The result shown in FIG. 4, (vi) may then be further processed according as shown in FIG. 5 or in FIG. 6.

Figure 5:
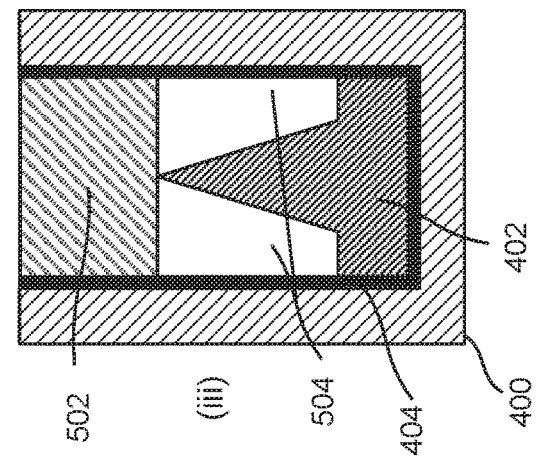
Figure 5:
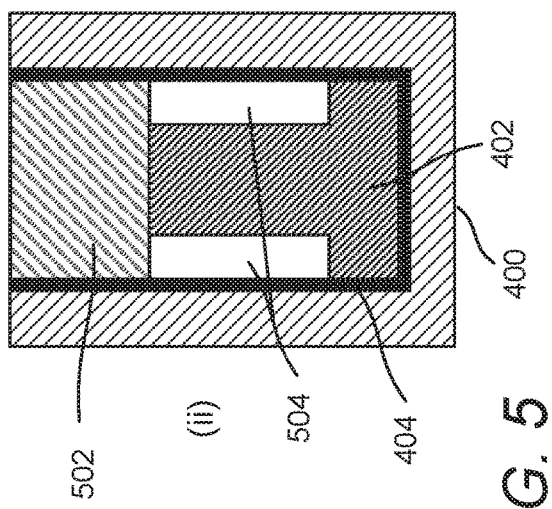

FIG. 5 illustrates portions of exemplary processes for fabricating an optimized contact according to some aspects. In FIG. 5, (i), the result shown in FIG. 4, (vi) is followed by a conformal (e.g., reflow) deposition of a filler material 500, such as $SiO_2$, which fills the rest of the recess and completely surrounds the upper portion of the contact 402. Alternatively, in FIG. 5, (ii), the result shown in FIG. 4, (vi) is followed by a non-conformal (e.g., CVD) deposition of a filler material 502, which again may be $SiO_2$, and which does not completely fill the recess above the contact 402 but instead leaves at least a portion of the recess unfilled, e.g., that leaves air gaps 504 surrounding the upper portion of the contact 402.

Figure 6:
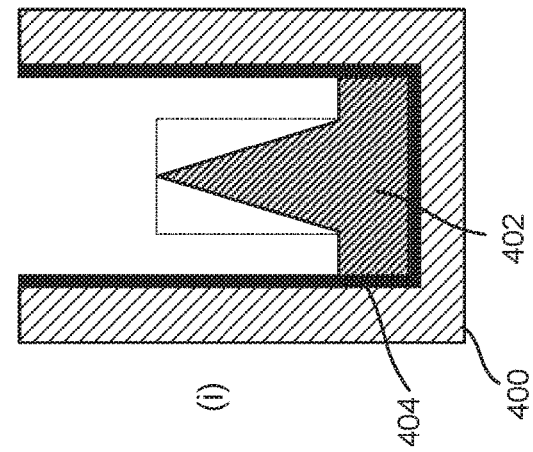

FIG. 6 illustrates portions of exemplary processes for fabricating an optimized contact according to some aspects. In FIG. 6, (i), the result shown in FIG. 4, (vi) is followed by an argon sputtering step. The argon ions tend to trim the sharpest edges the fastest, with the result that the substantially rectangular cross-section of the upper portion of the contact 402 is etched to a substantially triangular cross-section such as shown in FIG. 6 (i). In FIG. 6, (ii), the result shown in FIG. 6, (i) is followed by a conformal deposition of a filler material 500, which fills the rest of the recess and completely surrounds the upper portion of the contact 402. Alternatively, in FIG. 6, (iii), the result shown in FIG. 6, (i) is followed by a non-conformal deposition of a filler material 502, which does not completely fill the recess above the contact 402 but instead leaves at least a portion of the recess unfilled, e.g., that leaves air gaps 504. This filler material 502 may be a non-conformal insulating material, such as $SiO_2$.

The optimized contact so created may be a part of a semiconductor die that also includes a gate structure disposed within the substrate, at least a portion of the gate structure being substantially planar, being substantially parallel to the contact, and being separated from the lower portion of the second vertical cross-section of the contact by a first distance and being separated from the upper portion of the second vertical cross-section of the contact by a second distance greater than the first distance.

Figure 7:
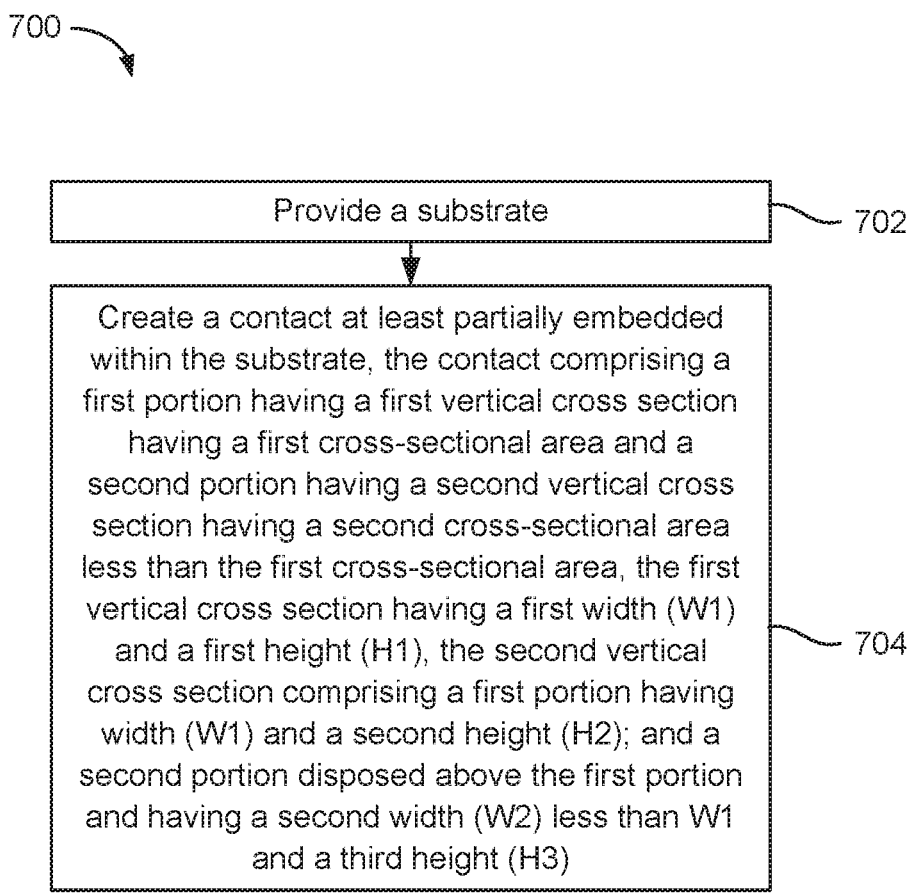
FIGS. 7 and 8 illustrate methods for fabricating an optimized contact according to some aspects.

FIG. 7 is a flowchart illustrating a partial method 700 for manufacturing a semiconductor die in accordance with some examples of the disclosure. As shown in FIG. 7, the partial method 700 may begin in block 702 with providing a substrate. The partial method 700 may continue in block 704 with creating a contact at least partially embedded within the substrate. The contact includes a first portion having a first vertical cross-section having a first cross-sectional area. The contact also includes a second portion having a second vertical cross-section having a second cross-sectional area less than the first cross-sectional area. The first vertical cross-section has a first width (W1) and a first height (H1). The second vertical cross-section includes a first portion having width (W1) and a second height (H2) and also include a second portion disposed above the first portion and having a second width (W2) less than W1 and a third height (H3).

In some aspects, the upper portion of the second vertical cross-section is substantially rectangular. In some aspects, the upper portion of the second vertical cross-section is at least partially surrounded by an insulating material. In some aspects, the insulating material comprises $SiO_2$. In some aspects, the insulating material comprises air.

In some aspects, the upper portion of the second vertical cross-section is substantially triangular. In some aspects, the upper portion of the second vertical cross section is at least partially surrounded by an insulating material. In some aspects, the insulating material comprises $SiO_2$. In some aspects, the insulating material comprises air.

In some aspects, the electrically conducting material comprises tungsten. In some aspects, the electrically conducting material comprises cobalt.

In some aspects, the method further includes creating a gate structure disposed within the substrate, at least a portion of the gate structure being substantially planar, being substantially parallel to the contact, and being separated from the lower portion of the second vertical cross-section of the contact by a first distance and being separated from the upper portion of the second vertical cross-section of the contact by a second distance greater than the first distance.

The optimized contacts described herein have a number of technical advantages over the prior art. For example, because the upper portion of the second portion of the contact is narrower than the lower portion of the second portion of the contact, the upper portion has less parasitic contact-gate parasitic capacitance than conventional contacts. Also existence of the upper portion allows a height reduction of the lower portion, because the combined cross-sectional area of the two portions is sufficient to avoid an increase in internal resistance of the contact. Thus, while for conventional contact designs a decrease in parasitic capacitance causes an increase in internal resistance and vice versa (i.e., they are mutually exclusive performance benefits), the optimized contacts described herein can achieve decreased parasitic capacitance without an increase in internal resistance. In other words, unlike conventional contacts, the optimized contacts disclosed herein show improved alternating current (AC) performance without a degradation in direct current (DC) performance.

Figure 8:
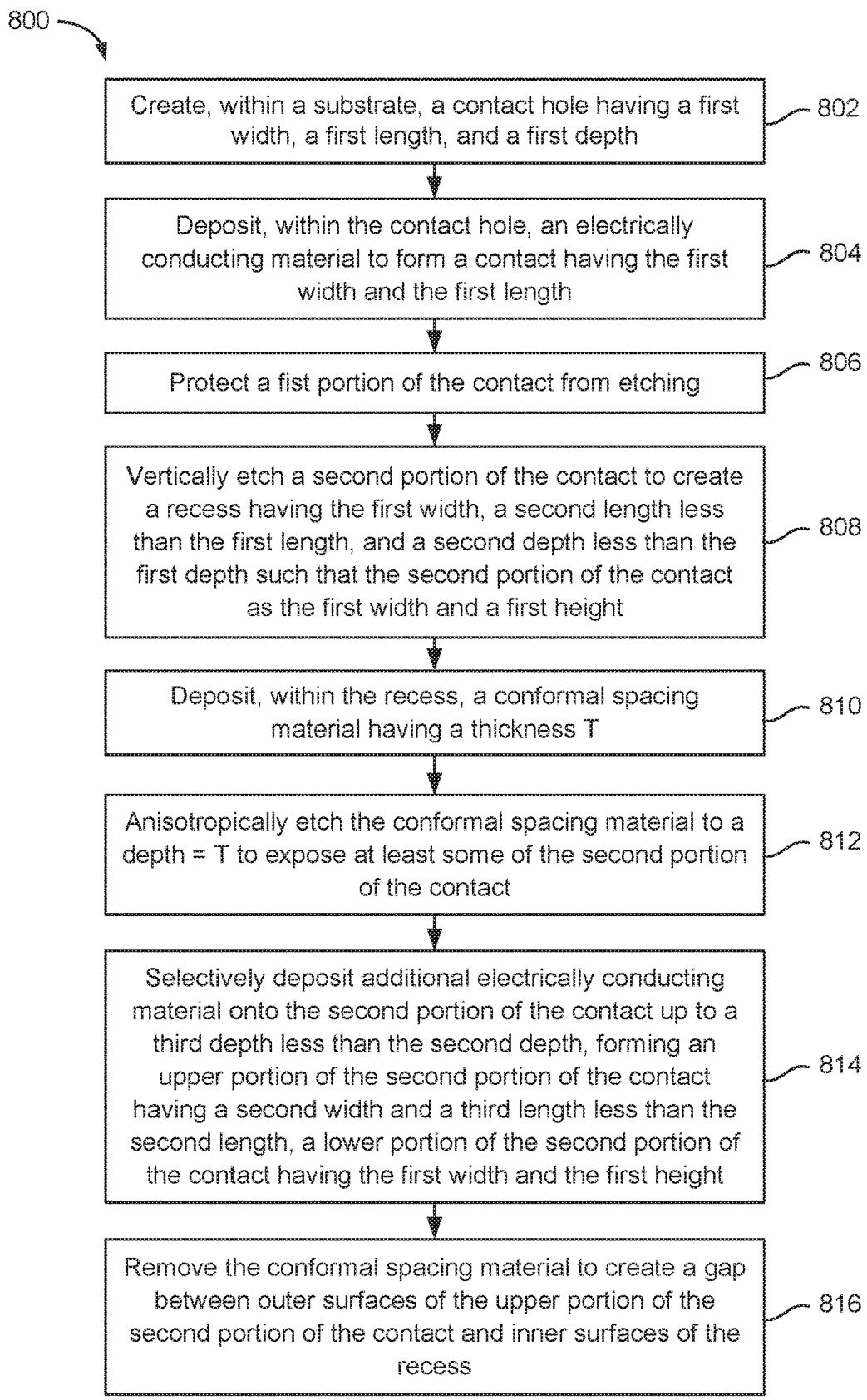

FIG. 8 is a flowchart illustrating a partial method 800 for fabricating a contact within a semiconductor die in accordance with some examples of the disclosure. As shown in FIG. 8, the partial method 800 may begin in block 802 with creating, within a substrate, a contact hole having a first width, a first length, and a first depth. In some aspects, the contact hole may be created by an isotropic or anisotropic etch process. The partial method 800 may continue in block 804 with depositing, within the contact hole, an electrically conducting material to form a contact having the first width and the first length. In some aspects, the electrically conducting material may comprise a metal. Examples of electrically conducting materials include, but are not limited to, tungsten and cobalt. In some aspects, a conformal insulating material may be deposited within the contact hole prior to depositing the electrically conducting material.

The partial method 800 may continue in block 806 with protecting a first portion of the contact from etching. In some aspects, the first portion of the contact is protected from etching by a resist layer or insulating layer. The partial method 800 may continue in block 808 with vertically etching a second portion of the contact to create a recess having the first width, a second length less than the first length, and a second depth less than the first depth such that the second portion of the contact has the first width and a first height. In some aspects, the vertical etch process is an anisotropic etch process.

The partial method 800 may continue in block 810 with depositing, with the recess, a conformal spacing material having a thickness T. The partial method 812 may continue in block 804 with anisotropically etching the conformal spacing material to a depth=T to expose at least some of the second portion of the contact. The partial method 800 may continue in block 814 with selectively depositing additional electrically conducting material onto the second portion of the contact up to a third depth less than the second depth, forming an upper portion of the second portion of the contact having a second width and a third length less than the second length, a lower portion of the second portion of the contact having the first width and the first height. The partial method 800 may continue in block 816 with removing the conformal spacing material to create a gap between outer surfaces of the upper portion of the second portion of the contact and inner surfaces of the recess.

In some aspects, the resulting gap will have a width of approximately T. In some aspects, the second width=the first width−2*T and wherein the third length=the second length−2*T. In some aspects, the upper portion of the second portion of the contact has a cross-sectional shape that is substantially rectangular.

In some aspects, the partial method 800 further includes depositing an insulating material into the recess to at least partially fill the gap between the outer surfaces of the upper portion of the second portion of the contact and the inner surfaces of the recess.

In some aspects, the insulating material is a conformal material that fully fills the gap between the outer surfaces of the upper portion of the second portion of the contact and the inner surfaces of the recess. In some aspects, the insulating material is a non-conformal insulating material that fills an upper portion of the recess but leaves at least a portion of the gap between the outer surfaces of the upper portion of the second portion of the contact and the inner surfaces of the recess unfilled.

In some aspects, the partial method 800 further includes creating a gate structure at least partially embedded within the substrate, at least a portion of the gate structure being substantially parallel to the contact, and being separated from the lower portion of the second portion of the contact by a first distance and being separated from the upper portion of the second portion of the contact by a second distance greater than the first distance.

In some aspects, the partial method 800 further includes etching the upper portion of the second portion of the contact to reduce its cross-sectional area. In some aspects, the upper portion of the second portion of the contact has a cross-sectional shape that is substantially triangular.

In some aspects, the partial method 800 further includes depositing an insulating material into the recess to at least partially fill the gap between the outer surfaces of the upper portion of the second portion of the contact and the inner surfaces of the recess. In some aspects, the insulating material is a conformal material that fully fills the gap between the outer surfaces of the upper portion of the second portion of the contact and the inner surfaces of the recess. In some aspects, the insulating material is a non-conformal insulating material that fills an upper portion of the recess but leaves at least a portion of the gap between the outer surfaces of the upper portion of the second portion of the contact and the inner surfaces of the recess unfilled.

In some aspects, the partial method 800 further includes creating a gate structure at least partially embedded within the substrate, at least a portion of the gate structure being substantially parallel to the contact, and being separated from the lower portion of the second portion of the contact by a first distance and being separated from the upper portion of the second portion of the contact by a second distance greater than the first distance.

Figure 9:
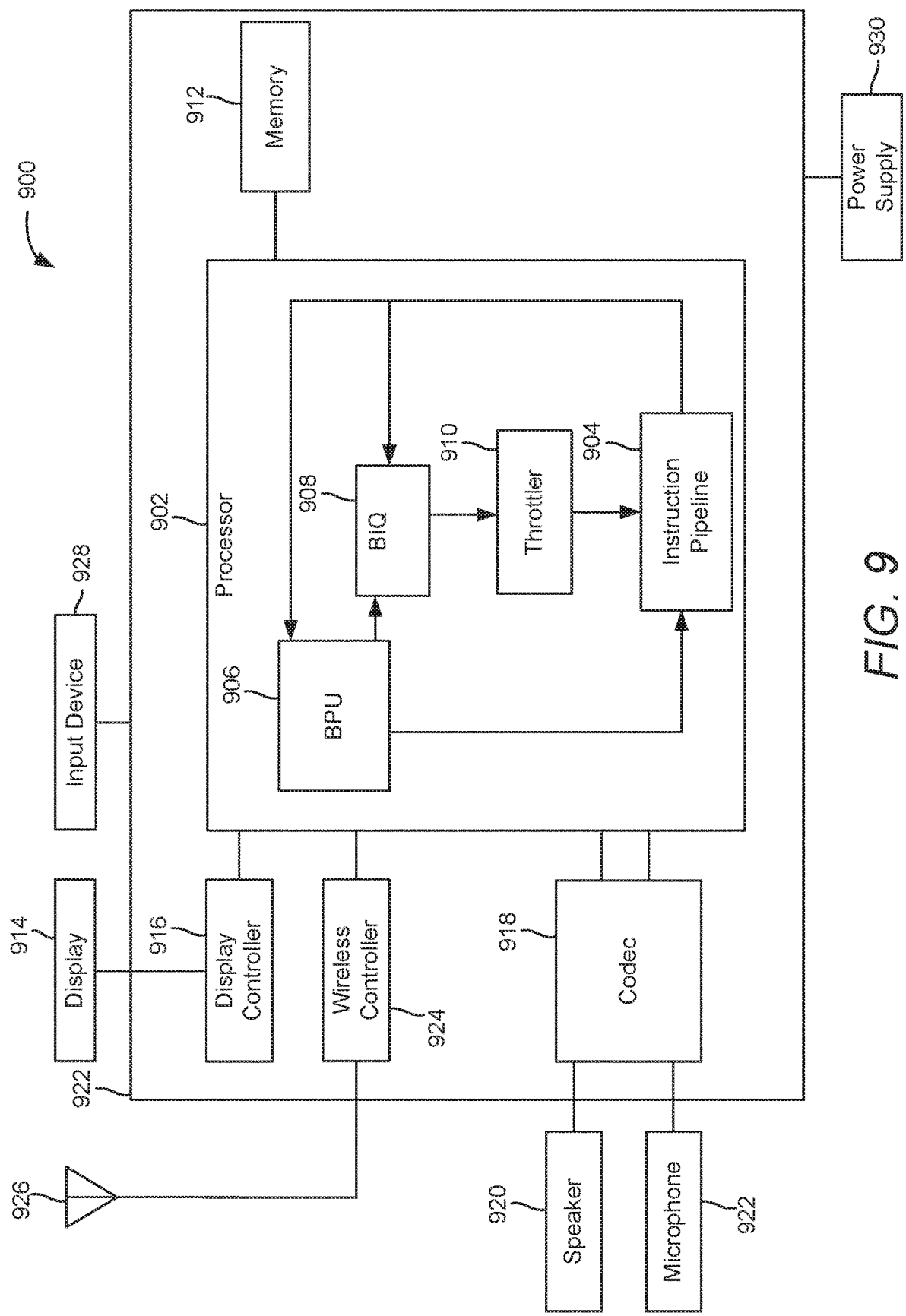
FIG. 9 illustrates an exemplary mobile device in accordance with one or more aspects of the disclosure.

FIG. 9 illustrates an exemplary mobile device in accordance with some examples of the disclosure. Referring now to FIG. 9, a block diagram of a mobile device that is configured according to exemplary aspects is depicted and generally designated mobile device 900. According to some aspects, mobile device 900 may be configured as a wireless communication device. As shown, mobile device 900 includes processor 902. Processor 902 is shown to comprise instruction pipeline 904, buffer processing unit (BPU) 906, branch instruction queue (BIQ) 908, and throttler 910 as is well known in the art. Other well-known details (e.g., counters, entries, confidence fields, weighted sum, comparator, etc.) of these blocks have been omitted from this view of processor 902 for the sake of clarity. Processor 902 may be communicatively coupled to memory 912 over a link, which may be a die-to-die or chip-to-chip link. Mobile device 900 also includes display 914 and display controller 916, with display controller 916 coupled to processor 902 and to display 914.

In some aspects, FIG. 9 may include coder/decoder (CODEC) 918 (e.g., an audio and/or voice CODEC) coupled to processor 902; speaker 920 and microphone 922 coupled to CODEC 918; and wireless controller circuits 924 (which may include a modem, radio frequency (RF) circuitry, filters, etc., which may be implemented using one or more flip-chip devices, as disclosed herein) coupled to wireless antenna 926 and to processor 902.

In a particular aspect, where one or more of the above-mentioned blocks are present, processor 902, display controller 916, memory 912, CODEC 918, and wireless controller circuits 924 can be included in a system-in-package or system-on-chip device, including but not limited to semiconductor die 200 or semiconductor die 300, which may be implemented in whole or part using the techniques disclosed herein. Input device 928 (e.g., physical or virtual keyboard), power supply 930 (e.g., battery), display 914, input device 928, speaker 920, microphone 922, wireless antenna 926, and power supply 930 may be external to system-on-chip device and may be coupled to a component of system-on-chip device, such as an interface or a controller.

It should be noted that although FIG. 9 depicts a mobile device, the processor 902 and memory 912 may also be integrated into a set top box, a music player, a video player, an entertainment unit, a navigation device, a personal digital assistant (PDA), a fixed location data unit, a computer, a laptop, a tablet, a communications device, a mobile phone, or other similar devices.

Figure 10:
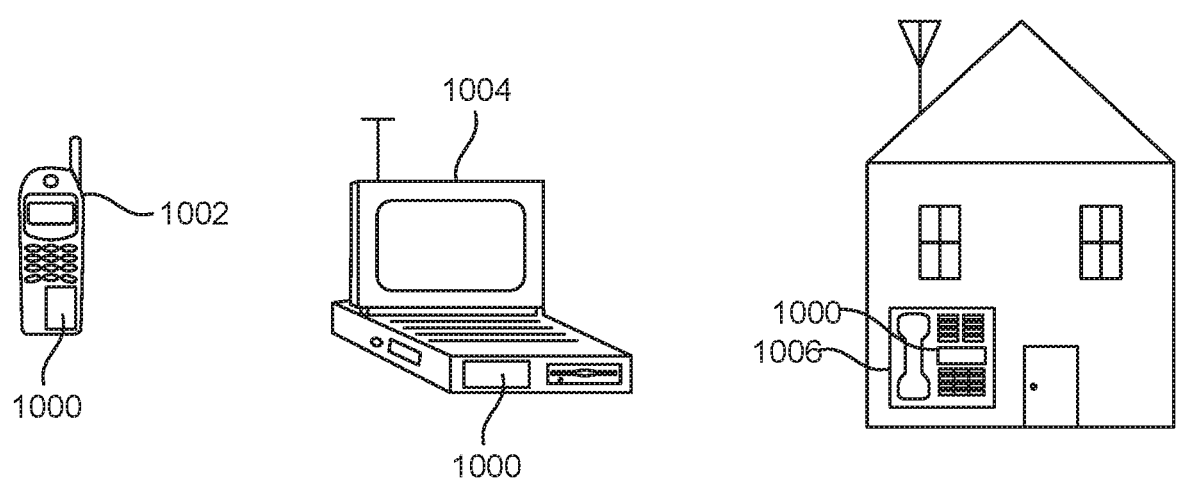
FIG. 10 illustrates various electronic devices that may be integrated with any of the aforementioned integrated device or semiconductor die in accordance with one or more aspects of the disclosure.

FIG. 10 illustrates various electronic devices that may be integrated with any of the aforementioned integrated device or semiconductor device 1000, which may be semiconductor die 200 or semiconductor die 300, in accordance with various examples of the disclosure. For example, a mobile phone device 1002, a laptop computer device 1004, and a fixed location terminal device 1006 may each be considered generally user equipment (UE) and may include semiconductor die 200 or semiconductor die 300 as described herein, for example. The semiconductor die 200 or semiconductor die 300 may be, for example, any of the integrated circuits, dies, integrated devices, integrated device packages, integrated circuit devices, device packages, integrated circuit (IC) packages, package-on-package devices described herein. The mobile phone device 1002, laptop computer device 1004, and fixed location terminal device 1006 illustrated in FIG. 10 are merely exemplary. Other electronic devices may also feature device including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device or any other device that stores or retrieves data or computer instructions or any combination thereof.

The foregoing disclosed packages, devices, and functionalities may be designed and configured into computer files (e.g., raster transfer language (RTL)_, graphic database system information interchange (GDSII), Gerber, etc.) stored on computer-readable media. Some or all such files may be provided to fabrication handlers who fabricate devices based on such files. Resulting products may include semiconductor wafers that are then cut into semiconductor die and packaged into a flip-chip or other package. The packages may then be employed in devices described herein.

It will be appreciated that various aspects disclosed herein can be described as functional equivalents to the structures, materials and/or devices described and/or recognized by those skilled in the art. For example, in one aspect, an apparatus may comprise a means for performing the various functionalities discussed above. It will be appreciated that the aforementioned aspects are merely provided as examples and the various aspects claimed are not limited to the specific references and/or illustrations cited as examples.

One or more of the components, processes, features, and/or functions illustrated in FIGS. 2A-10 may be rearranged and/or combined into a single component, process, feature or function or incorporated in several components, processes, or functions. Additional elements, components, processes, and/or functions may also be added without departing from the disclosure. It should also be noted that FIGS. 2A-10 and corresponding description in the present disclosure are not limited to dies and/or ICs. In some implementations, FIGS. 2A-10 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. In addition, these terms are intended to include all devices, including wireless and wireline communication devices, that are able to communicate with a core network via a radio access network (RAN), and through the core network the UEs can be connected with external networks such as the Internet and with other UEs. Of course, other mechanisms of connecting to the core network and/or the Internet are also possible for the UEs, such as over a wired access network, a wireless local area network (WLAN) (e.g., based on the Institute of Electrical and Electronic Engineers (IEEE) standard 802.11, etc.) and so on. UEs can be embodied by any of a number of types of devices including but not limited to printed circuit (PC) cards, compact flash devices, external or internal modems, wireless or wireline phones, smartphones, tablets, tracking devices, asset tags, and so on. A communication link through which UEs can send signals to a RAN is called an uplink channel (e.g., a reverse traffic channel, a reverse control channel, an access channel, etc.). A communication link through which the RAN can send signals to UEs is called a downlink or forward link channel (e.g., a paging channel, a control channel, a broadcast channel, a forward traffic channel, etc.). As used herein the term traffic channel (TCH) can refer to either an uplink/reverse or downlink/forward traffic channel.

The wireless communication between electronic devices can be based on different technologies, such as code division multiple access (CDMA), wide-band CDMA (W-CDMA), time division multiple access (TDMA), frequency division multiple access (FDMA), orthogonal frequency division multiplexing (OFDM), global system for mobile communications (GSM), the third generation partnership project (3GPP) long term evolution (LTE), fifth generation (5G) new radio (NR), Bluetooth (BT), Bluetooth low energy (BLE), IEEE 802.11 (WiFi), and IEEE 802.15.4 (Zigbee/Thread) or other protocols that may be used in a wireless communications network or a data communications network. Bluetooth low energy (also known as Bluetooth LE, BLE, and Bluetooth Smart) is a wireless personal area network technology designed and marketed by the Bluetooth Special Interest Group intended to provide considerably reduced power consumption and cost while maintaining a similar communication range. BLE was merged into the main Bluetooth standard in 2010 with the adoption of the Bluetooth Core Specification Version 4.0 and updated in Bluetooth 5.

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described hereby can be configured to perform at least a portion of a method described hereby.

It should be noted that the terms "connected," "coupled," or any variant thereof, mean any connection or coupling, either direct or indirect, between elements, and can encompass a presence of an intermediate element between two elements that are "connected" or "coupled" together via the intermediate element unless the connection is expressly disclosed as being directly connected.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Nothing stated or illustrated depicted in this application is intended to dedicate any component, action, feature, benefit, advantage, or equivalent to the public, regardless of whether the component, action, feature, benefit, advantage, or the equivalent is recited in the claims.

Further, those of skill in the art will appreciate that the various illustrative logical blocks, modules, circuits, and algorithm actions described in connection with the examples disclosed herein may be implemented as electronic hardware, computer software, or combinations of both. To clearly illustrate this interchangeability of hardware and software, various illustrative components, blocks, modules, circuits, and actions have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

Although some aspects have been described in connection with a device, it will be understood that these aspects also constitute a description of the corresponding method, and so a block or a component of a device should also be understood as a corresponding method action or as a feature of a method action. Analogously thereto, aspects described in connection with or as a method action also constitute a description of a corresponding block or detail or feature of a corresponding device. Some or all of the method actions can be performed by a hardware apparatus (or using a hardware apparatus), such as, for example, a microprocessor, a programmable computer or an electronic circuit. In some examples, some or a plurality of the method actions can be performed by such an apparatus.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or a plurality of claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods, systems, and apparatus disclosed in the description or in the claims can be implemented by a device comprising means for performing the respective actions and/or functionalities of the methods disclosed.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A semiconductor die comprising:
   a substrate; and
   a contact disposed within the substrate, the contact comprising:
      a first portion with a first vertical cross-section having a first cross-sectional area, the first vertical cross-section having a first width and a first height; and
      a second portion with a second vertical cross-section having a second cross-sectional area less than the first cross-sectional area, the second vertical cross-section comprising:
         a lower portion having the first width and a second height less than the first height; and
         an upper portion disposed above the lower portion and having a second width less than the first width, and having a third height less than the first height.

2. The semiconductor die of claim 1, wherein the upper portion of the second vertical cross-section is substantially rectangular.

3. The semiconductor die of claim 2, wherein the upper portion of the second vertical cross-section is at least partially surrounded by an insulating material.

4. The semiconductor die of claim 3, wherein the insulating material comprises $SiO_2$.

5. The semiconductor die of claim 3, wherein the insulating material comprises air.

6. The semiconductor die of claim 1, wherein the upper portion of the second vertical cross-section is substantially triangular.

7. The semiconductor die of claim 6, wherein the upper portion of the second vertical cross-section is at least partially surrounded by an insulating material.

8. The semiconductor die of claim 7, wherein the insulating material comprises $SiO_2$.

9. The semiconductor die of claim 7, wherein the insulating material comprises air.

10. The semiconductor die of claim 1, wherein the contact comprises an electrically conducting material.

11. The semiconductor die of claim 10, wherein the electrically conducting material comprises tungsten.

12. The semiconductor die of claim 10, wherein the electrically conducting material comprises cobalt.

13. The semiconductor die of claim 1, further comprising a gate structure disposed within the substrate, at least a portion of the gate structure being substantially planar, being substantially parallel to the contact, and being separated from the lower portion of the second vertical cross-section of the contact by a first distance and being separated from the upper portion of the second vertical cross-section of the contact by a second distance greater than the first distance.

14. A method of fabricating a semiconductor die, the method comprising:
   providing a substrate; and
   creating a contact at least partially embedded within the substrate, the contact comprising:

a first portion with a first vertical cross-section having a first cross-sectional area, the first vertical cross-section having a first width and a first height; and a second portion with a second vertical cross-section having a second cross-sectional area less than the first cross-sectional area, the second vertical cross-section comprising:

a lower portion having the first width and a second height less than the first height; and an upper portion disposed above the lower portion and having a second width less than the first width, and having a third height less than the first height.

15. The method of claim 14, wherein the upper portion of the second vertical cross-section is substantially rectangular.

16. The method of claim 15, wherein the upper portion of the second vertical cross-section is at least partially surrounded by an insulating material.

17. The method of claim 16, wherein the insulating material comprises $SiO_2$.

18. The method of claim 16, wherein the insulating material comprises air.

19. The method of claim 14, wherein the upper portion of the second vertical cross-section is substantially triangular.

20. The method of claim 19, wherein the upper portion of the second vertical cross-section is at least partially surrounded by an insulating material.

21. The method of claim 20, wherein the insulating material comprises $SiO_2$.

22. The method of claim 20, wherein the insulating material comprises air.

23. The method of claim 14, wherein the contact comprises an electrically conducting material.

24. The method of claim 23, wherein the electrically conducting material comprises tungsten.

25. The method of claim 23, wherein the electrically conducting material comprises cobalt.

26. The method of claim 14, further comprising creating a gate structure disposed within the substrate, at least a portion of the gate structure being substantially planar, being substantially parallel to the contact, and being separated from the lower portion of the second vertical cross-section of the contact by a first distance and being separated from the upper portion of the second vertical cross-section of the contact by a second distance greater than the first distance.

27. A method of fabricating a contact within a semiconductor die, the method comprising:

creating, within a substrate, a contact hole having a first width, a first length, and a first depth;

depositing, within the contact hole, an electrically conducting material to form the contact having the first width and the first length;

protecting a first portion of the contact from etching;

vertically etching a second portion of the contact to create a recess having the first width, a second length less than the first length, and a second depth less than the first depth such that the second portion of the contact has the first width and a first height;

depositing, with the recess, a conformal spacing material having a thickness T;

anisotropically etching the conformal spacing material to a depth=T to expose at least some of the second portion of the contact;

selectively depositing additional electrically conducting material onto the second portion of the contact up to a third depth less than the second depth, forming an upper portion of the second portion of the contact having a second width and a third length less than the second length, a lower portion of the second portion of the contact having the first width and the first height; and removing the conformal spacing material to create a gap between outer surfaces of the upper portion of the second portion of the contact and inner surfaces of the recess.

28. The method of claim 27, wherein the second width=the first width−2*T and wherein the third length=the second length−2*T.

29. The method of claim 27, wherein the upper portion of the second portion of the contact has a cross-sectional shape that is substantially rectangular.

30. The method of claim 27, further comprising depositing an insulating material into the recess to at least partially fill the gap between the outer surfaces of the upper portion of the second portion of the contact and the inner surfaces of the recess.

31. The method of claim 30, wherein the insulating material is a conformal material that fully fills the gap between the outer surfaces of the upper portion of the second portion of the contact and the inner surfaces of the recess.

32. The method of claim 30, wherein the insulating material is a non-conformal insulating material that fills an upper portion of the recess but leaves at least a portion of the gap between the outer surfaces of the upper portion of the second portion of the contact and the inner surfaces of the recess unfilled.

33. The method of claim 30, further comprising:

creating a gate structure at least partially embedded within the substrate, at least a portion of the gate structure being substantially parallel to the contact, and being separated from the lower portion of the second portion of the contact by a first distance and being separated from the upper portion of the second portion of the contact by a second distance greater than the first distance.

34. The method of claim 27, further comprising etching the upper portion of the second portion of the contact to reduce its cross-sectional area.

35. The method of claim 34, wherein the upper portion of the second portion of the contact has a cross-sectional shape that is substantially triangular.

36. The method of claim 34, further comprising depositing an insulating material into the recess to at least partially fill the gap between the outer surfaces of the upper portion of the second portion of the contact and the inner surfaces of the recess.

37. The method of claim 36, wherein the insulating material is a conformal material that fully fills the gap between the outer surfaces of the upper portion of the second portion of the contact and the inner surfaces of the recess.

38. The method of claim 36, wherein the insulating material is a non-conformal insulating material that fills an upper portion of the recess but leaves at least a portion of the gap between the outer surfaces of the upper portion of the second portion of the contact and the inner surfaces of the recess unfilled.

39. The method of claim 36, further comprising:

creating a gate structure at least partially embedded within the substrate, at least a portion of the gate structure being substantially parallel to the contact, and being separated from the lower portion of the second portion of the contact by a first distance and being separated from the upper portion of the second portion of the contact by a second distance greater than the first distance.

* * * * *